United States Patent

[11] 3,620,846

[72] Inventors Thomas O. Paine
Administrator of the National Aeronautics and Space Administration with respect to an invention of;
Herman P. Valentijn, Glendora, Calif.

[21] Appl. No. 26,573
[22] Filed Apr. 8, 1970
[45] Patented Nov. 16, 1971

[54] DEPLOYABLE SOLAR CELL ARRAY
23 Claims, 17 Drawing Figs.

[52] U.S. Cl. .......... 136/89, 312/257
[51] Int. Cl. .......... H01l 15/02
[50] Field of Search .......... 136/89

[56] References Cited

UNITED STATES PATENTS 3,532,299 10/1970 Williamson et al. .......... 136/89 X

*Primary Examiner*—Allen B. Curtis
*Attorneys*—J. H. Warden, Monte F. Mott and G. T. McCoy

ABSTRACT: A deployable support particularly suited for use in operatively supporting arrays of solar cells aboard spacecraft, characterized by a plurality of independent modules, each including a panel formed of a plurality of trapezoidal panel segments and articulated track segments adapted to be stowed in a folded configuration and simultaneously deployed into a laterally extended and a substantially continuous surface circumscribing an associated spacecraft for positioning arrays of solar cells in an operative disposition. A particular feature of the support is an inclusion of cantilever structure which accommodates deployment of panels of solar cells in a continuous harmonic sequence for thereby substantially eliminating the normally attendant transient loading of spacecraft during panel deployment.

HERMAN P. VALENTIJN
INVENTOR

J. H. Warden

ATTORNEYS

HERMAN P. VALENTIJN
INVENTOR
J. H. Warden
ATTORNEYS

HERMAN P. VALENTIJN
INVENTOR
J. H. Warden
ATTORNEYS

HERMAN P. VALENTIJN
INVENTOR
J.H. Worden
ATTORNEYS

DEPLOYABLE SOLAR CELL ARRAY

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

1. Description of the Invention

The invention relates to deployable supports and more particularly to a deployable support for use in deploying from spacecraft arrays of solar cells for presentation to a source of radiation.

2. Description of the Prior Art

The prior art includes numerous deployable cantilever supports for use in supporting panels bearing arrays of solar cells. Normally, when deployed, the panels are outwardly displaced from a spacecraft and are supported by radially disposed, boomlike structures in order to accommodate a use of a relatively large number of cells. Frequently, in order that an adequate number of solar cells be provided, the booms must be of a length which renders it unwieldy. Further, such lengths tend to introduce structural complexity as the booms must be stored on board the spacecraft during its launching and subsequently extended in order that the arrays of solar cells be deployed.

Normally, the booms are segmented and folded about pivot points into a multifold configuration for stowage and ultimately extended, through pivotal displacement, for purposes of deployment. Where a pivoted boom is unfolded, during its deployment, a shifting of the instantaneous center of mass of the boom-supported panels of solar cells has accompanied the deployment thus causing transient loads to be applied to the spacecraft. Such transient loading is particularly significant in those instances where panel deployment is not fully synchronized for achieving a simultaneous deployment of the panels.

Consequently, there currently exists a need for a deployable cantilever support which simplifies the deployment of arrays of solar cells and which substantially obviates transient loading of a spacecraft during the deployment of the arrays.

OBJECTS AND SUMMARY OF THE INVENTION

It is therefore an object of the instant invention to provide an improved cantilever support.

Another object is to provide a segmented support including multiple panel segments adapted to be deployed from a stowed configuration to a configuration having a maximized surface area and a minimized length.

Another object of the instant invention is to provide an improved deployable support for operatively supporting spacecraft instrumentation in cantilever fashion.

Another object is to provide an improved deployable support for use in deploying arrays of solar cells into an operative disposition relative to a source of radiation located in celestial space.

Another object is to provide for use aboard spacecraft an improved, deployable cantilever support having a multiplicity of panel segments deployed in a manner which minimizes the effects of the shifting of the instantaneous center of mass of the panels as the panels are deployed, whereby transient loading of a spacecraft, during deployment of the panel segments, substantially is avoided.

It is another object of the invention to provide for an harmonic sequential shifting of the instantaneous center of mass of segments of a stowed support panels as the panel is deployed from within a multiplicity of modules arranged in a diametrically opposed relationship circumscribing the surface of an operative spacecraft.

These and other objects and advantages are achieved through the provision of simplified deployable support including a plurality of articulated, cantilever tracks and associated panel segments interconnected in a manner such that the panels are slidingly deployed in a continuous harmonic sequence for effecting a gradual shifting of the instantaneous center of mass, whereby transient loading of an associated spacecraft substantially is precluded as the panel segments are deployed into a maximized surface area having a minimized length.

DESCRIPTION OF THE PREFERRED EMBODIMENT

Figure 1:
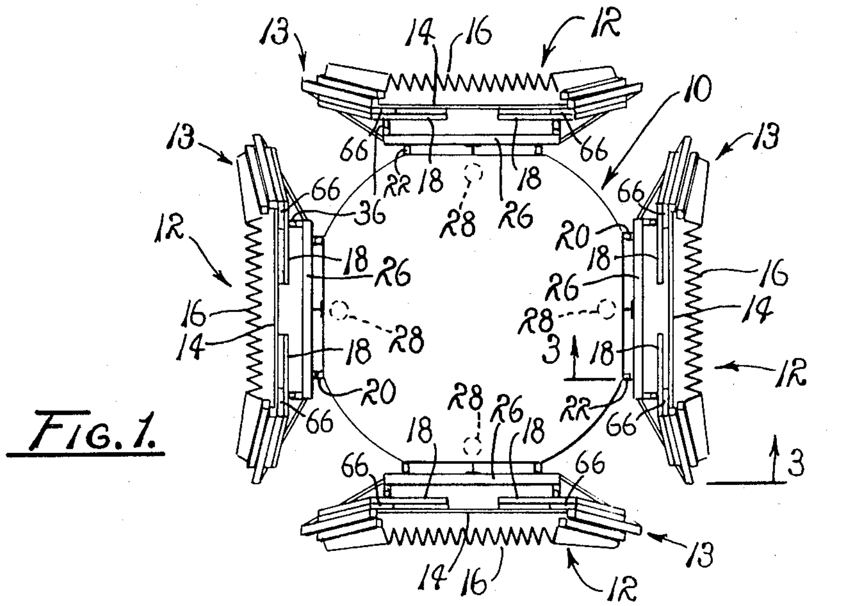
FIG. 1 is a top plan view of the deployable support embodying the principles of the instant invention, illustrating a preferred relationship of a plurality of associated modules employed in maintaining the support of the instant invention in a stowed configuration.

Referring now to the drawings wherein like reference characters designate like or corresponding parts throughout the several views there is shown in FIG. 1 a base 10 which, as a practical matter, is the skin of a spacecraft, not designated. Since the base 10 is of any convenient design and forms no particular part of the instant invention, a detailed description thereof is omitted. However, as can readily be appreciated, the base 10 may be provided on any one of a large number of spacecraft.

A plurality of panel modules 12 are mounted about the base 10 in a manner such that they are arranged in diametrical opposition. While four such modules are shown in the drawings, it is to be understood that, where found desirable, the number of modules may be varied.

Figure 2:
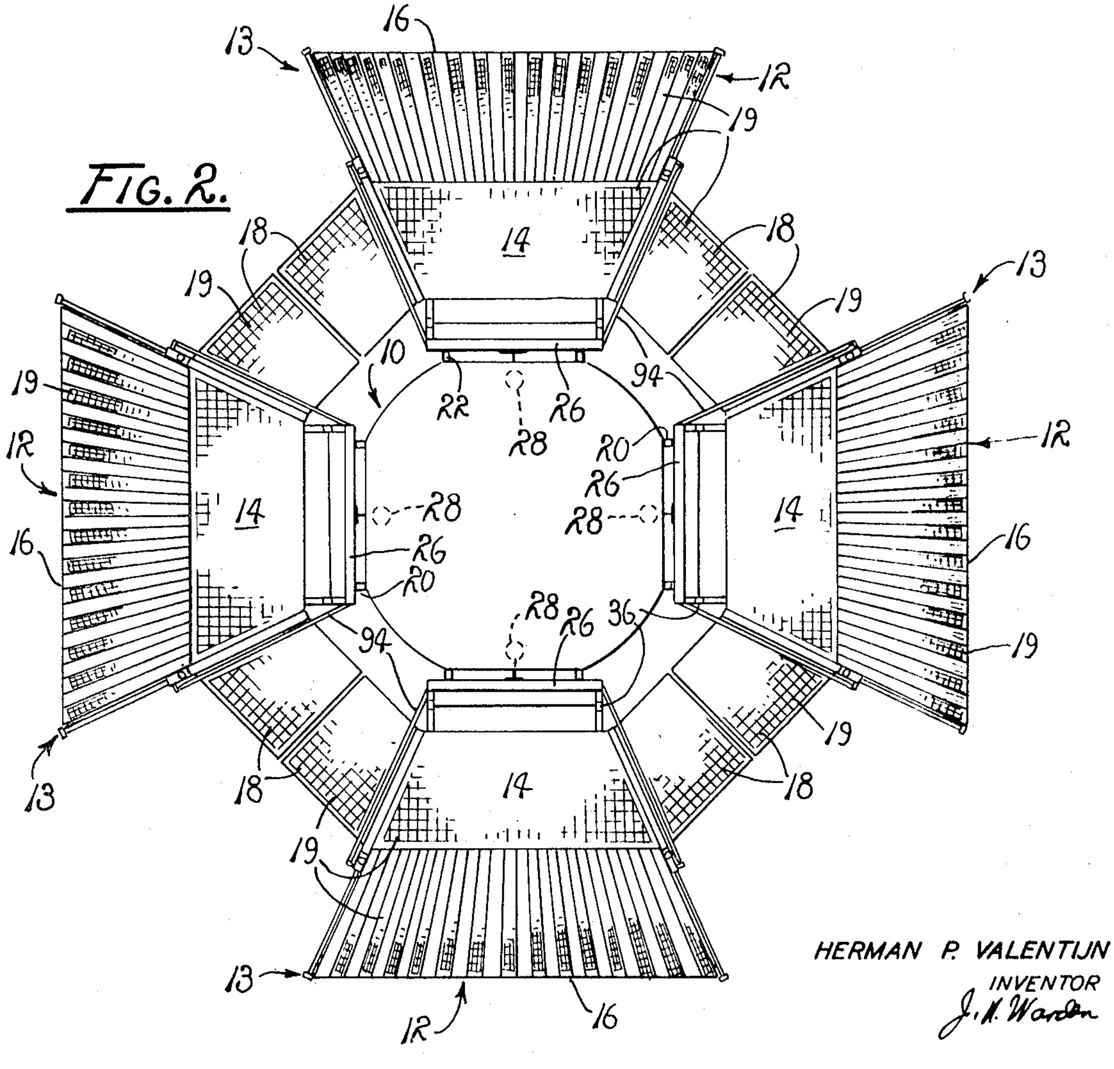
FIG. 2 is a top plan view of the deployable support of FIG. 1, illustrating the support in its fully deployed configuration.

Each of the panel modules 12 includes therein a deployable panel 13 having an inboard panel segment 14, an outboard panel segment 16 and a pair of wing panel segments 18 which sequentially are deployed into an expanded configuration. The panel segments 14, 16, and 18, when deployed, are of a trapezoidal configuration, having radially extended side edges, and are arranged to establish an annular solar panel circumscribing the spacecraft for purposes of supporting arrays of solar cells 19, as best illustrated in FIG. 2. As a practical matter, the outboard panel segments 16 are formed as a flexible member including articulated flats 17, also of an elongated and trapezoidal configuration interconnected in a manner which permits the panels to be stowed in a corrugated configuration and ultimately drawn into an expanded and taut condition, as shown in FIG. 2.

While the support of the instant invention has particular utility in deploying arrays of solar cells, it is to be understood that the panels 13 could be employed in supporting various structures such as, for example, reflectors, detectors, communication link components, and various types of system and experimental instrumentation.

Preferably, deployment of the panels 13 of all four modules 12 simultaneously is initiated in order that transient loading of the associated spacecraft be minimized. However, where found practical, the panels 13 can be deployed from a module 12 in any given sequence, due to the fact that their deployment is achieved in a continuous, harmonic sequence which achieves a gradual shift in the instantaneous center of mass of each of the panel segments.

As all of the modules 12 are of a similar design and function in a similar manner and for a similar purpose, a detailed description of a single module and its mode of operation is believed sufficient to provide for a complete understanding of the invention. Therefore, it is to be understood that the following description which relates to a single module 12 is applicable to all of the modules 12.

Figures 3, 4, 5, 15, 16:
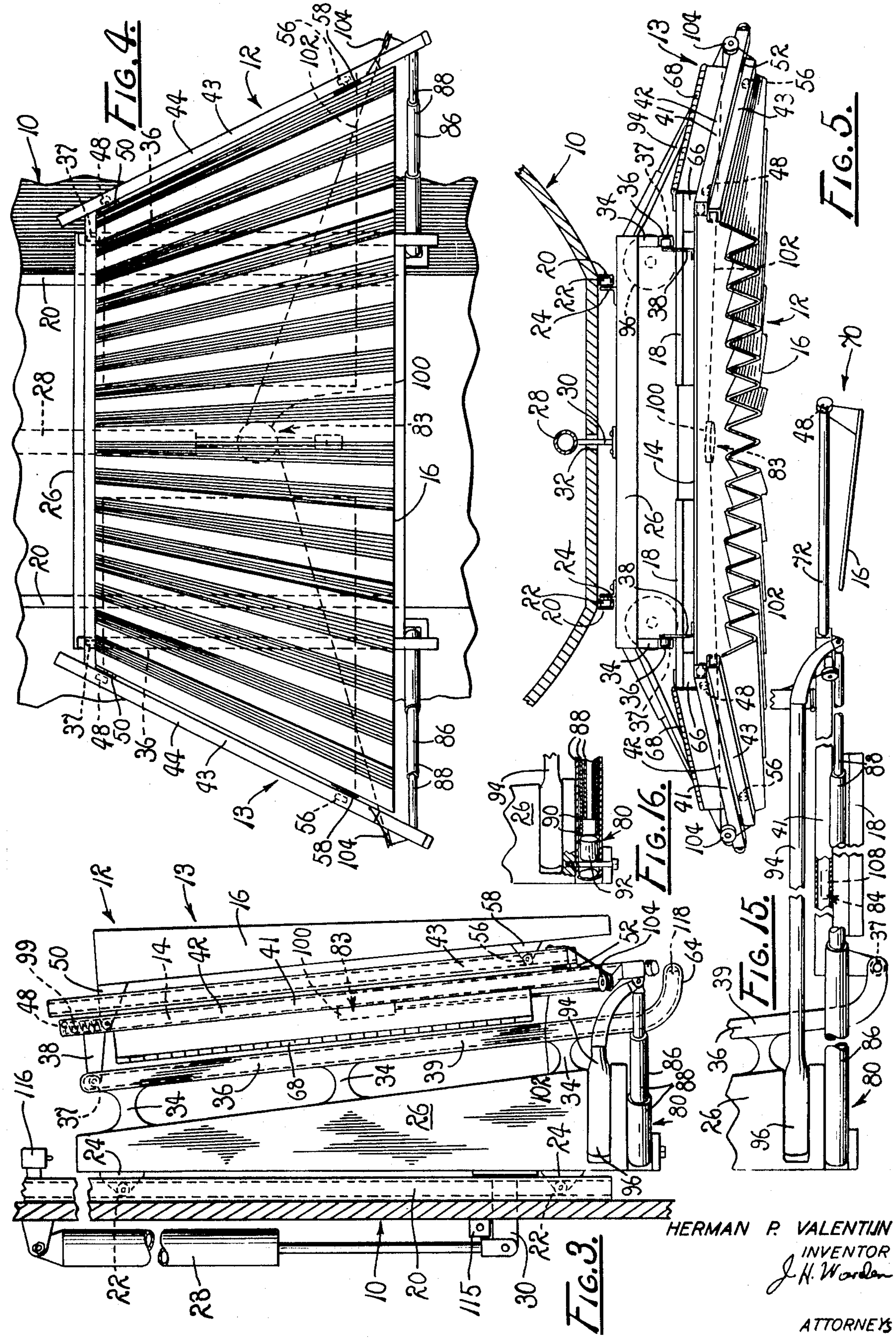
FIG. 3 is a partially sectioned side elevation of one of the modules, as illustrated in FIG. 1, and taken generally along line 3—3 of FIG. 1.
FIG. 4 is a front elevation of a module shown in FIG. 3.
FIG. 5 is a top of the view of the module shown in FIG. 4.
FIG. 15 is a partially sectioned fragmentary view of an actuator employed in deploying the panels of the deployable support.
FIG. 16 is a fragmentary sectional view of gas generator employed by the actuator of FIG. 15.

As best illustrated in FIGS. 3 and 5, the panel module 12 is coupled with the base 10 through a pair of parallel base tracks 20. The tracks 20 rigidly are coupled to the external surface of the base 10 and are extended parallel to a given axis of the spacecraft, normally its longitudinal axis or, where appropriate, its axis of rotation. As shown in FIG. 5, each of the tracks 20 is of a channular configuration and receives therein a bearing supported caster 22. The casters 22 are fixed to the distal end of a plurality of suitable brackets 24 extended in a supporting relationship from a module support 26. By employing the casters 22 seated within the tracks 20, the module support 26 is afforded reciprocation, along a path paralleling the aforementioned axis of rotation.

Reciprocation of the module support 26 is imparted thereto through a suitable linear actuator 28 coupled with the module support through a suitable drive including a convenient linkage 30 extended through an opening 32 formed in the base 10. Consequently, through an activation of the actuator 28, the module 26 is advanced along the base track 20 in selected directions. The actuator 28 is of any suitable design, including a pneumatic piston-driven type. Hence, the actuator includes a suitable control mechanism, including a control circuit, not shown, for purposes of controlling its direction of operative displacement.

The module support 26 serves to support the module 12 through a track-mounting base 34 to which is coupled a pair of module support tracks 36. These tracks receive therein module support casters 37 coupled with the inboard end of the panel 14 through suitable brackets 38. The tracks 36 serve to define a base segment 39 of a deployable, articulated track 40 which is stowed in and deployed from the module 12 along with the panel segments 14, 16, and 18, as best sown in FIGS. 2, and 9 through 13. The track 40 is fabricated from multiple lengths of beamlike channular members of a design sufficient for receiving and supporting displaceable casters. When deployed, the track 40 is a cantilever track extended radially from the spacecraft. In addition to the module support track 36 of the base segment 39, the articulated track 40 also includes a pair of diverging tracks 41, which form an inboard track segment 42, and a pair of terminal tracks 43 joined with the tracks 41 near their distal end, which form a terminal track segment 44 of the articulated track 40.

The tracks 41 are secured to the opposite diverging side edges of the panel segment 14 through any convenient means, including brackets, spotwelds and the like, not shown, which rigidly couple the panel segment 14 between the pair of tracks 41. The divergent relationship of the tracks is achieved as a consequence of the trapezoidal configuration of the inboard panel segment 14 to which the tracks 41 rigidly are secured. Disposed in a spaced relationship with the panel segment 14 there is provided for each of the tracks 41 a slotted opening 46 extending the length thereof. These slots receive casters 48 which rotatably are pinned to brackets 50. The brackets are secured to and serve to support the distal end of the outboard panel segment 16. Consequently, the casters 48 are adapted to substantially traverse the length of the tracks 41 of the segment 42 during the deployment of the panel 16.

Each of the tracks 43 of the terminal track segment 44 pivotally is coupled near the distal end of an adjacent track 41 of the track segment 42 through a hinge 52 which serves quite satisfactorily for this purpose. The hinge 52 is so mounted as to permit the track 43 to be pivotally displaced into an overlying relationship with the adjacent track 41, for stowage, while yet permitting the tracks 42 pivotally to advance into a deployed configuration, as best illustrated in FIGS. 6 and 7A.

Each of the tracks 43, of the segment 44, also includes a slotted opening 54 which extends along its length and receives therein a bearing-supported caster 56. The casters 56 rotatably are coupled to mounting brackets 58 which, in turn, are secured to the inboard end of the panel segment 16. Therefore, rectilinear displacement of the casters 56 along the slots 54 readily is accommodated for thereby accommodating a radial displacement of the panel segment 16.

Figures 6, 7A, 7B:
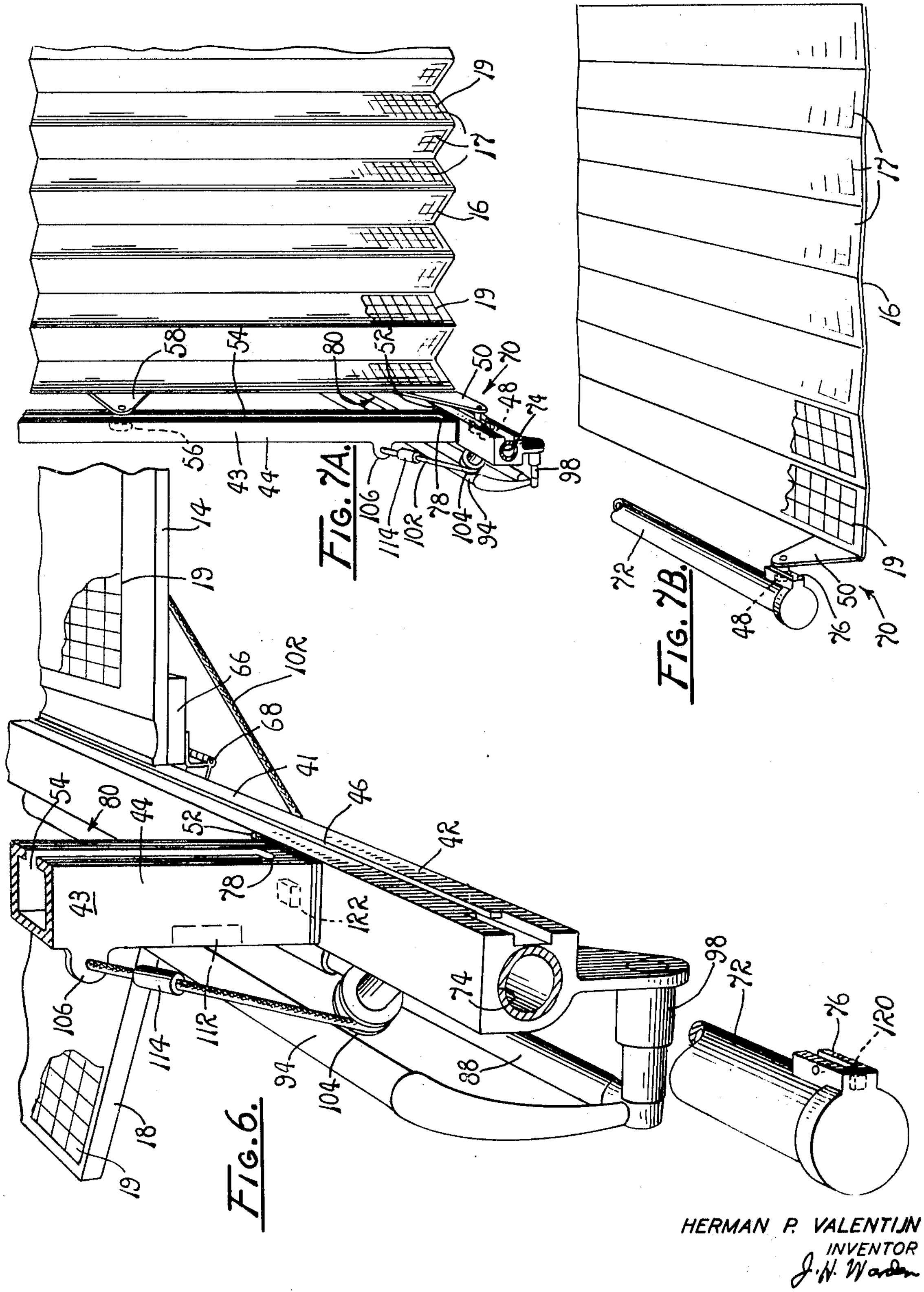
FIG. 6 is a fragmentary perspective view of the support of FIG. 1 as the support is deployed into its fully deployed configuration.
FIGS. 7A and 7B together illustrate successive positions assumed by a panel segment during a deploying sequence for the panels shown in FIG. 2.

As best depicted in FIGS. 6 and 7A, each of the tracks 43 is coupled with an adjacent track 41 in a manner such that as the distal end of the track 43 is elevated, with respect to the track 41, its pivotal displacement is limited so that the track segment 44 is caused to assume a position wherein its longitudinal axis is substantially perpendicular to the longitudinal axis of the track segment 42. Therefore, as the casters 56 are displaced they are caused to advance in a plane substantially normal to the plane of the path of the casters 48, as they are advanced along the track segment 42.

As shown in FIG. 5, each of the module support tracks 36, of the base segment 39, is coupled with a track 41 of the inboard track segment 42 through one of the casters 37. Therefore, it is to be understood that the casters 37 are afforded displacement along the parallel tracks 36. Limited caster displacement is desirable to preclude an uncoupling of the articulated track 40. This is achieved by providing the individual tracks 36 with suitable stop, not designated, which serves to interrupt caster displacement and thus precludes extraction of the caster 37 from the lowermost end of the track.

Furthermore, in order to enhance a lateral deployment of the inboard track segment 42, the lowermost end portion of each of the tracks 36 of the base segment 39 includes an outwardly directed, arcuate terminal portion 64. This portion has a radius which accommodates substantial lateral displacement of the supported casters 37 sufficient to accommodate a positioning of the inboard track segment 42, as depicted in FIGS. 8 through 14, in order that the panel segment be readily deployed.

In addition to supporting the inboard panel 14, the beamlike structure-forming tracks 41, of the track segment 42, further serves as a cantilever support for the wing panels 18. These panels are coupled along one radial edge surface to an adjacent track 41 through a suitable mounting block 66 which depends from the track. This coupling is achieved through an intermediate, spring-loaded piano hinge 68. Since spring-loaded piano hinges are well known, a detailed description thereof is omitted, however, it is to be understood that through the hinge 68 the wing panels 18 are afforded forced, pivotal displacement into a deployed configuration, as shown in FIG. 2. As a practical matter, the panels 18 are pivotally displaced to their stowed disposition and retained therein by assuming an abutted relationship with an adjacent track 36.

Figures 8, 9, 10, 11, 12, 13:
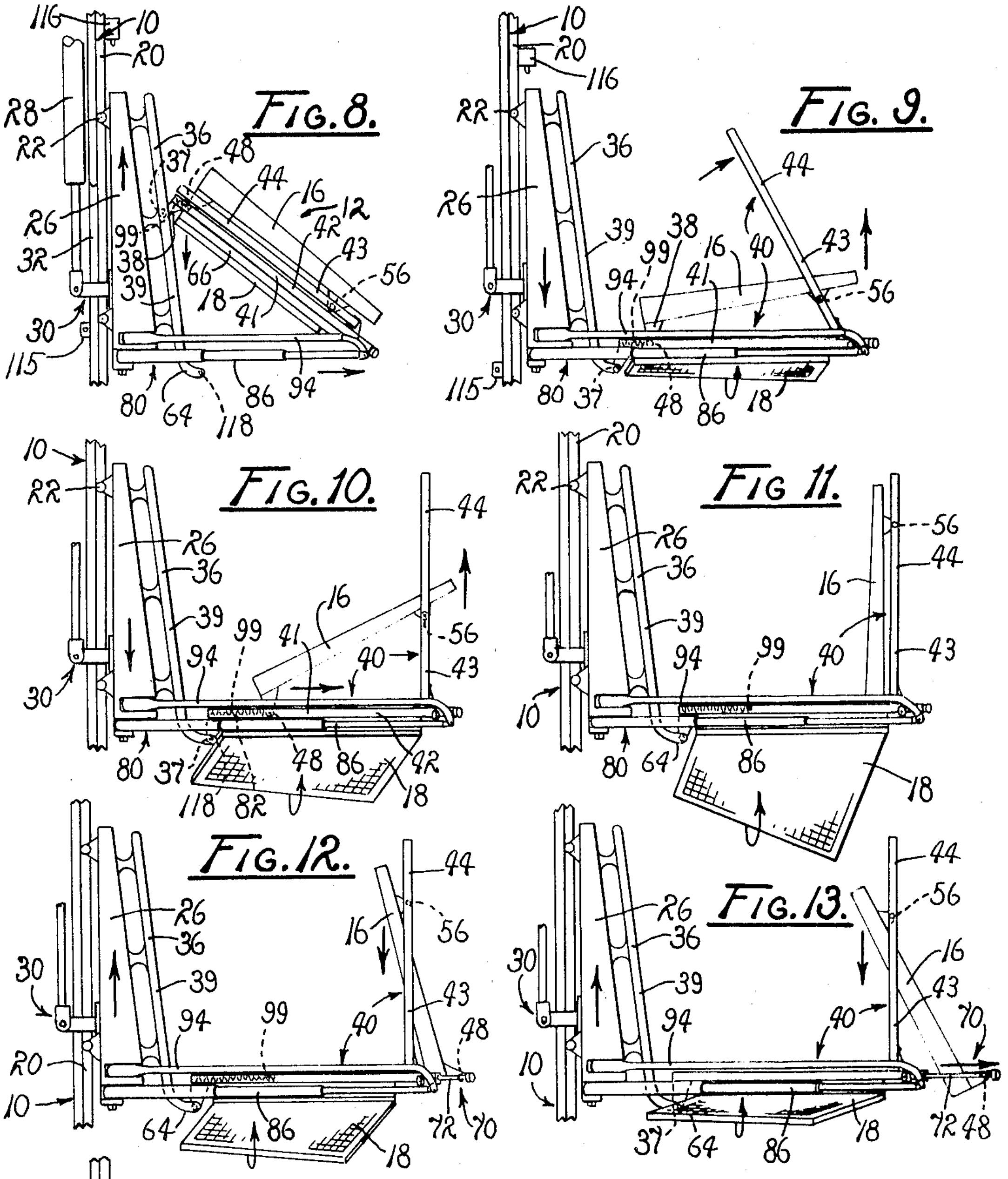
FIGS. 8 through 14 comprise side elevations of a panel during its deployment.

It is to be understood that as the articulated track 40 is deployed, as illustrated in FIGS. 8 through 13, the panel segments 14 through 18 are deployed concurrently therewith. Deployment is initiated as the casters 37 are displaced downwardly relative to the module support track 36, as illustrated in FIG. 8. As the downward displacement of the casters 37 is achieved, a simultaneous lateral displacement of both the supported end of the inboard panel segment 14 and the inboard track segment 42 is achieved so that as the casters are caused to seat in the arcuate portion 64 of the tracks 36 the inboard panel segment 14 is caused to assume a laterally extended disposition, as shown in FIG. 9.

Once the casters 37 have been seated, the casters 48 are displaced outwardly for advancing the panel segment 16, relative to the base 10, along the length of the diverging tracks 41. As lateral displacement of the distal end of the panel segment 16 is achieved, a vertical displacement of the inboard end of the panel segment 16 is achieved, as the casters 56 are elevated along the slot 54 of the individual tracks 43 of the terminal track segment 44. Continued lateral displacement of the casters 48 causes the inboard end of the panel segment 16 to pass beneath the distal end of the panel segment 16, as illustrated in FIG. 11, so that the panel segment 16, in effect, is inverted as it is displaced to its deployed disposition.

It is important here to note that as the panel segments 14 and 16 become fully deployed, they assume a substantially coplanar relationship. Therefore, it is necessary to provide means for accommodating a continued lateral displacement of the distal end of the outboard panel segment 16, in order that this segment be brought into a coplanar relationship with the inboard panel segment 14. Such displacement is accommodated through a panel carriage 70. This carriage includes a pair of elongated panel support booms 72 which are telescopingly received within the beamlike structure of the tracks 41. As a practical matter, the booms 72 are received in elongated tubular openings 74, of a cylindrical configuration, paralleling the slotted openings 46.

At the distal end of each of the booms 72 there is provided a U-shaped spring-loaded clip 76, of any suitable design, which receives and secures therein a caster 48 as the caster is caused to be displaced in extended displacement beyond the terminus of the tracks 41. An axial displacement imparted to the booms 72 serves to transport the distal end of the panel segment 16 in a lateral direction and to draw the casters 56 downwardly along the slots 54 until the booms 72 have become fully extended and the casters 56 have become fully seated at the lowermost portion of the slot 54. As a practical matter, each of the slots 54 includes an outwardly directed detent 78 formed therein in order to accommodate a seating of the casters 56.

Deployment of the wing panel segments 18 is achieved concurrently with the deployment of the panel segment 16 since deployment of the panel segment 16 is initiated as the inboard panel segment 14 assumes a laterally extended disposition, and the wing panel segments 18 thus are released from their stowed configuration for forced pivotal displacement about the spring-loaded piano hinge 68. Consequently, deployment of the panel segments 14 through 18 is completed as the casters 56 come to rest in the detents 78 of the terminal track segment 44 of the module 12.

In order to assist in deploying the segments 14 through 18, of the panel 13, and the segments 39, 42 and 44, of the articulated track 40, each module 12 preferably includes multiple actuators of convenient designs. For example, in addition to the actuator 28 each of the modules 12 also includes a gas-operated actuator 80, coupled with the distal end of the inboard panel track segments 42; a compressed-spring actuator 82, coupled with the brackets 50; a reel-and-cable actuator 83, coupled with the track segment 44; and a gas-driven actuator 84, coupled with the booms 72 of the panel carriage 70. Since these actuators are employed in a gravity-free environment and therefore meet minimal resistance during deployment, they may singly be employed. However, where preferred, they can be ganged or arranged in related parts. Therefore, for purposes of describing the invention, a description of a single actuator of each type of actuator employed hereinafter is provided.

As best illustrated in FIGS. 15 and 16, the gas-operated actuator 80 includes a segmented, telescoping boom 86 including therein a plurality of self-sealing tubular segments 88. Each of the segments 88 is of a unique diameter and includes a peripheral flange 90 which engages the internal surface of an adjacent segment 88, as it telescopingly is received therein, in a manner such that an hermetic seal is established therebetween. A gas generator 92 is coupled with the boom 86 and is adapted to be electrically initiated to deliver expanding gases to the boom segments so that the gases developed thereby serve to extend the telescoping boom in a manner consistent with the principles of gas-driven actuators.

For purposes of rendering structural support, the actuator 80 further includes an extendible boom 94. Preferably, the boom 94 is a furlable tube, payable from a rotatably supported reel 96. This tube is adapted to extend in substantial parallelism with the telescoping boom 86 for thereby imparting rigidity to the panel 13 as it is supported in its deployed configuration. Since such tubes are well known, a detailed description thereof is omitted in the interest of brevity. The telescoping boom 86 and the extendible boom 94 fixedly are supported at one end, near the lowermost portion of the module support 26, while the terminal portions thereof are connected to the distal end of the individual tracks 41 through a coupling 98. This coupling includes a bearing pin and sleeve union of suitable design for reducing friction during deployment of the panel segments. Since the boom 86 and tube 94 together serve to support the distal end of the inboard panel segment 14, as well as the inboard end of the outboard panel segment 16, the spacing established between the gas generator 92 and the reel 96 is such as to impart a desired rigidity to the fully deployed panel 13.

The compressed-spring actuator 82 serves to assist in the displacement of the distal end of the outboard panel segment 16 as it is deployed from its stowed configuration, as shown in FIG. 9. Since such actuators are well known, a detailed description is omitted in the interest of brevity. However, it is to be understood that the actuator 82 includes a compression spring 99 adapted to be foreshortened, through loading compression, and ultimately released for achieving a rapid elongation. As a practical matter, each of the employed springs 99 is retained in its foreshortened state through a solenoid-driven trigger mechanism, not shown. Preferably, the spring 99 of each of the actuators is disposed within a suitable housing, not designated, formed within the innermost end of the tracks 41, coupled with one of the brackets 50 and so disposed as to act thereagainst for imparting lateral displacement to the associated inboard panel segment 16.

The reel-and-cable actuator 83 is provided with a spring-biased reel 100, preferably controlled through a pawl and ratchet. Each actuator 83 suitably is supported beneath the panel segment 14 and is coupled to one of the tracks 43 through a flexible cable 102 extended therebetween. The cable is trained around a suitably supported sheave 104 located between a coupling eye 106 fixed to the track and the reel. The reel 100 is, in practice, released through a selective operation of a suitable solenoid-driven release mechanism, also not shown. Release of the reel 100 is effected, and the cable 102 is tensioned, as advancement of the casters 48 is initiated in order to assist in the displacement of the track 43, as it is pivotally displaced about the hinge 52, under the influence of an artificial gravity environment. When fully deployed, the track segment 44 assumes a substantially vertical disposition in order that the inboard end of the panel segment 16 can be elevated as the segments are inverted. Once a vertical disposition is imposed on the tracks 43 of the segment 44, the articulated track 40 assumes a radially extended, generally U-shaped cantilever configuration. Consequently, elevation of the inboard end of the outboard panel segment 16 is accommodated so that the outboard end thereof freely can pass from the terminus or distal end of the track 41 as the casters 48 are advanced.

The gas-driven actuator 84 is of a design similar to that of the actuator 80. This actuator also employs a gas generator, designated 108. This generator is of a design quite similar to the gas generator 92 and is mounted to communicate with the tubular opening 74 adjacent to the inboard end of the boom 72 of the panel carriage 70. Since the gas generator 84 is similar in design and function to the gas generator 92, a detailed description thereof is omitted. However, it is to be understood that as the generator 108 is operated it serves to develop gas, confined under pressure, which is delivered to impinge against the innermost ends of the booms 72 for partially discharging the booms 72 of the panel carriage 70 from the distal ends of the track 41. The discharge of the booms serve to draw the distal end of the panel 16 laterally and the inboard end of the panel 16 downwardly.

As a practical matter, once the outboard panel segments 16 of the modules 12 have been brought into a substantial coplanar relationship with the inboard panel segment 14, the upstanding tracks 43 of the terminal track segments 44 become superfluous. Since the tracks 43 can act to cast shadows across the arrays 19, the terminal track segments 44 preferably are severed.

Figure 14:
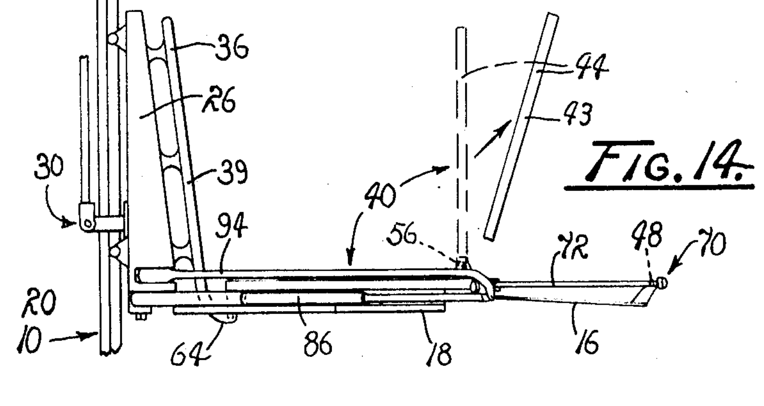

Severance of the track segments 44 is achieved through a use of explosive charges 112 which circumscribe each of the individual tracks 43, at points spaced from the detents 78. Furthermore, a similar charge 114, FIG. 6, is employed in a similar manner for purposes of serving the cable 102. Since explosive-severing techniques are well known, a detailed description of the technique employed in the severance of the track segments 44, and the associated cable 102 is omitted. However, it is to be understood that at an appropriate point during the deployment of the panels, preferably at the termination of the panel-deployment sequence, the charges 112 and 114 are initiated for explosively severing and jettisoning the tracks 43 and cable 102, as best illustrated in FIG. 14.

Deployment of the panels 13 is achieved employing an imposed artificial gravity environment. This environment twice is inverted during a sequential, two-phase deployment sequence. During the first phase of the deployment sequence each of the module supports 26 is advanced upwardly for thereby imposing an artificial gravity environment, so that the associated panel module 12 is caused to descend. As the module 12 descends it assumes a laterally extended disposition, within a plane normally related to the centerline of the base 10. During the second phase of operation, the module supports 26 descend and again ascend for purposes of inverting the imposed artificial environment for purposes of deploying the panel segments 16 and 18. Hence, it should readily be apparent that the principle components of inertia act in directions generally paralleling the centerline of the associated base 10.

In order to impose displacement control for thus dictating directional displacement of the modules 12, there is provided a multiplicity of microswitches, of a suitable design, appropriately arranged to detect a completion of serial portions of a deployment sequence. In practice, each of the microswitches is coupled between a suitable source of electrical potential, not shown, and a control circuit for a selected actuator.

As illustrated, a microswitch 115 is associated with the linkage 30 so that a predetermined displacement of the linkage serves to actuate the microswitch. Actuation of this switch closes an electrical circuit to the actuator 80 and thus initiates its operation as the module support 26 is displaced along the base track 20. Hence, the boom 86 is extended outwardly as the module support 26 is advanced upwardly and the module 12 is displaced downwardly under the influence of an artificial gravity environment.

A microswitch 116 is disposed within the upper portion of the path of the module support 26 and is so arranged that as the actuator 28 drives the module support 26 through an appropriate upward displacement the microswitch is engaged and actuated. The microswitch 116 is coupled with the control circuit of the actuator 28 and serves to effect a reversing of its mode of operation and hence reverses the direction of travel for the module support 26, for thus initiating the second phase of the deployment sequence, and for inverting the imposed artificial gravity environment.

As depicted in FIG. 8, a microswitch 118 is mounted at the lowermost end of the module support track 36. As the inboard track 42 appropriately is positioned adjacent to the arcuate portion 64 of the track 36, this microswitch is actuated and an electrical circuit is closed to the solenoid-driven trigger mechanism of the actuator 82 and to release mechanism of the reel-and-cable actuator 83. The compressed spring 99 thus is released for thereby assisting in displacing the outboard panel segment 16 toward its deployed disposition while the cable 102 simultaneously is tensioned to rotate the track segment 44.

Within the clip 76 there is provided still another microswitch 120 which is adapted to be actuated as a caster 48 is seated therein. This microswitch is coupled with the control circuit for the actuator 28 as well as a control circuit actuator 84, not shown. As the microswitch 120 is actuated by the caster, an electrical circuit is completed to the control circuit of the actuator 28, for again imparting an upward displacement to the module support 26, and also to initiate an operation of the gas generator 108 so that the booms 72 are driven outwardly, as the module support 26 is driven upwardly for purposes of again inverting the artificial gravity environment and effecting a seating of the panel 16 in its fully deployed disposition.

Within the lowermost end portions of the tracks 43, there is an additional microswitch 122 which electrically is coupled with the explosive charges 112 and 114 and for initiating the charges as the casters 56 are seated within the detent 78. Though an initiation of the explosive charges the track segments 44 are severed and jettisoned from the base 100.

It is to be understood, of course, that each of the microswitches 115 through 122 is coupled with any appropriate source of electrical energy which normally is provided aboard a spacecraft. Furthermore, the disclosed microswitches are adjustably positioned for achieving a desired operative timing. Furthermore, due to the nature of the various types of actuators which may be employed, the switch positions, as illustrated, are deemed merely to be representative of examples of preferred locations for the microswitches. Therefore, the control circuit and switch combinations, as well as their position relative to operative structure are, in practice, varied as found practical.

OPERATION

It is believed that in view of the foregoing description, the operation of the deployable support will be readily understood and it will be briefly reviewed at this point. With the panel segments 14, 16 and 18 of each of the panels 13 folded into a compact configuration and stowed in multiple, diametrically opposed modules 12, the base 10 is prepared to be launched into celestial space. Once in space, a synchronous and sequential deployment of all the panels is initiated through a simultaneous energization of the control circuits of the actuators 28.

As the actuators 28 are energized, in response to a suitable command signal delivered through convenient circuitry employed aboard the base 10, the linkage 30 simultaneously are displaced for driving the module supports 26 upwardly along the base tracks 20. Displacement of the linkages 30 serves to activate microswitches 115, as the module supports 26 are displaced upwardly along the base tracks, as viewed in FIG. 3. Due to effects of inertia, the displacement of the module supports 26 imposes an artificial gravity environment on the modules 12, whereupon the panel segments 14, 16 and 18, as well as the folded segments of the articulated tracks 40 simultaneously are forced to move downwardly along the module support tracks 36 as the module supports 26 upwardly are displaced. Concurrently with this displacement, the gas actuators 80 are activated so that the resulting displacement of the modules 12 generally is both downwardly and outwardly, relative to the base 10. The resulting motion, therefore, includes translational as well as rotational components.

Continued upward displacement of the module supports 26 causes the microswitches 116 to be engaged and actuated by the module supports 26 as they come to rest. As the microswitches 116 are actuated, displacement of the modules is reversed at approximately the same time that microswitches 118 are actuated, as a seating of the casters 37 is achieved. Hence, the second phase of the deployment thus is initiated. During this second phase, the panel segments 16 are advanced outwardly along the tracks 41 as the module supports 26 are forced downwardly, through an operation of the actuators 28. This downward motion also serves to invert the artificial gravity environment in that the effects of inertia is utilized in forcing the track segments 44 to rotate about the hinges 52 and the inboard ends of the panel segments 16 to "climb" the track segments 44 as illustrated to FIG. 9.

Concurrently, with the initiation of the downward movement of the module supports 26 of the cables 102 are tensioned, through a release of the reels 100, in response to an actuation of microswitches 118. Due to the positioning of the track segments 42, a downfolding of the panel segments 18, about their hinges 68, is initiated, as the compressed springs 99 of the actuators 82 simultaneously are released for assisting in an advancement of the distal ends of the outboard panel segments 16. As distal ends are advanced, the inboard end portions of the panel segments 16 are elevated, as they are displaced along the terminal track segments 44, as best illustrated in FIG. 10.

As the distal ends of the outboard panel segments 16 are advanced, they are caused to pass beneath the elevated ends of the outboard panel segments so that the elevated ends ultimately are disposed at the inboard ends of the outboard panel segments 16. Consequently, a total inversion of the outboard panel segments is achieved, as best illustrated in FIGS. 12 and 13.

In order to achieve an inversion of the outboard panel segments 16, the casters 48 forcibly are displaced into the clips 76 of the booms 72 and are seated against the microswitches 120. The switches upward are actuated whereupon a responsive activation of the actuators 28 is effected and an operation of the gas generator 108, of the gas actuator 84, is initiated for again driving the module support 26 upwardly and the booms 72 in an outwardly directed, axial displacement. Due to the imposed upward displacement of the module supports 26 an artificial gravity environment again is imposed on the panels 13 for seating the outboard panel segments 16. It is to be understood that as the booms 72 are displaced, the outboard panel segments 16 are caused to expand transversely into a taut configuration, due to the diverging configuration of the tracks 40 for bringing the flats 17 into a coplanar relationship. As the inboard ends of the segments 16 are seated, the detents 78 arrest displacement of the casters 56. Once the outboard panel segments 16 are fully expanded and deployed, the seated casters 56 engage and close microswitches 122, whereupon as a responsive severance of the track segments 44 and cables 102 is achieved so that a deployment of the panels 13 thus is completed.

With particular reference to FIGS. 8 through 14, it can be seen that deployment of the panel segments 18 is achieved concurrently with the deployment of the outboard panel segments 16 It is to be understood that at the completion of the downward displacement of the module support 26, during the first half of the second phase of the panel deployment sequence, the panel segments 18 are caused to complete 90° of angular displacement, while at the end of the second phase of deployment the segments 18 have been rotated through 180° of rotation, into a fully deployed configuration.

It here is noted that the shifting of the mass of the various panel segments principally is achieved in directions paralleling the longitudinal axis, or axis of rotation of the base 10, rather than transversely with respect to this axis, and that in each phase of the deployment, linear momentum is minimized due to the cancelling effects of the opposed force components developed during a dynamic loading of the panel segments. Hence, it can be seen that the panel 13 of each of the modules 12 is deployed in a manner such that the combined center of mass is shifted in increments and caused to describe a substantially harmonic path for thereby minimizing transient loading of the associated base 10.

Although the invention has been herein shown and described in what is conceived to be the most practical and preferred embodiment, it is recognized that departures may be made therefrom within the scope of the invention, which is not be be limited to the illustrative details disclosed.

What is claimed is:

1. A deployable solar cell array comprising:

A. a base circumscribing a given axis;

B. a multiplicity of pairs of panel modules mounted on said base in a manner such that said modules of said pairs are arranged in a substantially opposed relationship at opposite sides of said base, each of said modules including therein a deployable panel, each panel comprising a plurality of deployable panel segments, said segments being adapted to be deployed into a laterally extended, and substantially coplanar relationship defining a substantially continuous planar cantilever surface extended in a plane intersecting said axis and circumscribing said base and at least one of said panels including a plurality of solar cells mounted thereon: and C. means coupled with said modules adapted to achieve a substantially simultaneous deployment of said panel segments from said module.

2. A deployable solar cell array comprising:

A. an articulated track comprising a plurality of interrelated, adjacent track segments, each segment including a pair of elongated tracks;

B. an articulated panel of a substantially planar configuration including a plurality of interrelated, adjacent panel segments, each segment being adapted to be deployed into a substantially planar configuration and at least one of said segments including a plurality of solar cells mounted thereon; and C. suspension means coupling said panel segments with the track segments and adapted to be displaced along the articulated track for deploying said panel segments; and D. a plurality of actuators connected with said articulated track and with said articulated panel adapted to sequentially be activated for concurrently deploying the articulated track and the articulated panel.

3. The solar cell array of claim 2 wherein said panel segments are adapted to be deployed into a substantially coplanar relationship.

4. The solar cell array of claim 2 further comprising:

A. means defining a rigid base;

B. a pair of base tracks mounted on the rigid base; and

C. means displaceably seated in the base tracks supporting said articulated panel and said articulated track.

5. The deployable solar cell array of claim 2 wherein the adjacent track segments of said articulated track are arranged in a mutually perpendicular relationship, when deployed, and the adjacent segments of the panel are arranged in a substantially coplanar relationship, when deployed.

6. The solar cell array of claim 5 wherein each of the panel segments is of a substantially trapezoidal configuration.

7. The solar cell array of claim 6 wherein one of said segments of the panel is deployed into a planar configuration from a substantially corrugated configuration.

8. The solar cell array of claim 7 wherein each elongated track of each track segment includes means defining therein an elongated slot, and said suspension means includes a plurality of casters fixed to said panel segments and seated in said slots.

9. The solar cell array according to claim 8 wherein one of said panel segments is inverted as it is deployed.

10. The solar cell array of claim 2 wherein said plurality of actuators includes a gas generator.

11. A segmented, deployable solar cell array including a support for supporting solar cells aboard a spacecraft and adapted to be stowed in a collapsed configuration and deployed into an expanded cantilever configuration including:

A. a pair of base tracks fixed to an external surface of the spacecraft;

B. a displaceable module support fixed to said base tracks and supported for rectilinear reciprocation;

C. a pair of module support tracks fixed to said module support;

D. a panel module mounted for rectilinear reciprocation along said module support track and including therein a plurality of deployable panel segments adapted to be deployed into a substantially coplanar relationship at least one of said panel segments including an array of solar cells disposed along one planar surface thereof and E. deployment means for effecting deployment of said panel segments, including an actuator for displacing said module support along said pair of base tracks and an actuator for displacing said panel module along said module support tracks.

12. The solar cell array of claim 11, wherein said plurality of panel segments includes:

A. an inboard segment adapted to be deployed by the deployment means in a plane extended normal to a given axis of the spacecraft and an outboard segment adapted to be deployed by the deployment means into a substantially coplanar relationship with the inboard segment; and B. a pair of wing panels adapted to deploy into a substantially coplanar relationship with said inboard segment, at opposite sides thereof.

13. The solar cell array of claim 12 wherein each of said panel segments of a substantially trapezoidal configuration having converging side edge surfaces.

14. The solar cell array of claim 13 wherein the outboard panel is stowed in a corrugated configuration adapted to be deployed into a substantially planar configuration.

15. The solar cell array of claim 14, further comprising means for inverting said outboard panel as it is deployed.

16. A deployable solar array cell including a support adapted to be stowed in a collapsed configuration within a plurality of diametrically related modules substantially circumscribing a spacecraft having a given axis and to be deployed into an expanded configuration extended laterally from the axis, said support comprising, a plurality of panel segments arranged within each of said modules including an inboard panel segment, an outboard panel segment, and a pair of wing panel segments, coupled with the inboard segment, each of said segments being of a trapezoidal configuration and adapted to be deployed in a manner such that the wing segments and the inboard segments are contiguously related for establishing a substantially continuous planar surface circumscribing the spacecraft and at least one of said segments including a plurality of solar cells.

17. The solar cell array of claim 16 wherein said outboard segments are deployed from a corrugated configuration into a planar configuration extending outwardly from inboard segments in a substantially coplanar relationship therewith.

18. The solar cell array of claim 17 further comprising means for deploying said panels including:

A. an articulated track adapted to be deployed from a folded configuration into a cantilever track configuration;

B. a plurality of casters coupling said panel segments with said track in a manner such that the panel segments are supported for displacement along the track; and C. a plurality of actuators interconnected with said track and with said panel segments adapted to concurrently deploy said panels and said track.

19. The solar cell array 18 wherein said articulated track includes:

A. a first track segment having a pair of tracks extended in a plane substantially parallel to the given axis of the spacecraft;

B. a second track segment having a pair of tracks adapted to be extended in a plane substantially normal to the plane of the first track segment;

C. a third track segment having a pair of tracks extended in a plane substantially parallel to the plane of the first track segment;

C. a third track segment having a pair of tracks extended in a plane substantially parallel to the plane to the first track segment;

D. means interconnecting the inboard end of the inboard panel segment with the pair of tracks of the first track segment;

E. first coupling means coupling the outboard end of the outboard panel segment with the second track segment in a manner such that the first coupling means is caused substantially to traverse the length of the second track segment as the outboard panel segment is deployed:

F. second coupling means coupling the inboard end of said outboard panel segment with the tracks of the said third track segment in a manner such that the second coupling means is caused to substantially traverse the length of the tracks of the third track segment as the outboard panel segment is deployed; and G an operable panel carriage adapted to receive therein said first coupling means and to transport the outboard end of the outboard panel segment from the tracks of the second track segment for thus causing the coupling means coupling the inboard end of said outboard panel segment to reverse direction of travel along the tracks of said third track segment and to cause the outboard end of the outboard panel segment to be deployed into a substantially coplanar relationship with the inboard panel segment.

20. The solar cell array of claim 19 further comprising a plurality of spring-loaded hinges operatively suspending the wing panel segments from the inboard panel segments in a manner such that the wing panel segments are pivoted about the hinges into a coplanar, cantilevered relationship with the inboard panel segment.

21. The solar cell array of claim 20 further comprising means adapted to explosively sever the third track segment once the panel segments are deployed into a substantially coplanar relationship.

22. The solar cell array of claim 18 wherein deployment of said panels is achieved in sequential phases of operation, and said actuators include means adapted to impose an inverting artificial gravity environment on said panel segments during their deployment, whereby deployment of the panel segments is enhanced.

23. The solar cell array of claim 18 wherein each of said modules includes a module support displaceably mounted on a pair of tracks substantially paralleling the given axis, and said plurality of actuators includes means adapted to impart reciprocation to said module support as said panel segments are deployed, whereby a series of inverting artificial gravity environments are imposed on said support for enhancing deployment of said panels.

* * * * *